United States Patent [19]
Liu et al.

[11] Patent Number: 5,789,771
[45] Date of Patent: Aug. 4, 1998

[54] CAMEL-GATE FIELD-EFFECT TRANSISTOR WITH MULTIPLE MODULATION-DOPED CHANNELS

[75] Inventors: Wen-Chau Liu, Tainan; Wen-Shiung Lour, Chi-Lung; Jung-Hui Tsai, Tainan, all of Taiwan

[73] Assignee: National Science Council of Republic of China, Taipei, Taiwan

[21] Appl. No.: 761,977

[22] Filed: Dec. 11, 1996

[51] Int. Cl.$^6$ .................................................. H01L 29/72
[52] U.S. Cl. ...................... 257/287; 257/212; 257/192; 257/193; 257/194; 257/279; 257/280
[58] Field of Search .................... 257/279, 280, 257/287, 212, 192, 193, 194

[56] References Cited

U.S. PATENT DOCUMENTS

| | | | |
|---|---|---|---|
| 4,590,502 | 5/1986 | Morkoc | 257/279 |
| 5,151,758 | 9/1992 | Smith | 257/287 |
| 5,250,826 | 10/1993 | Chang et al. | 257/279 |
| 5,410,167 | 4/1995 | Saito | 257/280 |
| 5,610,410 | 3/1997 | Imanishi | 257/280 |

FOREIGN PATENT DOCUMENTS

| | | | |
|---|---|---|---|
| 401293574 | 11/1989 | Japan | 257/279 |

OTHER PUBLICATIONS

Thorne et al., Analysis of Camel Gate FET's (CAMFET's), IEEE Transactions on Electron Devices, vol. ED-30, pp. 212-216, Aug. 1983.

Lin et al., An Anisotype GaAs/InxGa1-xAs Heterojunction Field-Effect Transistor for Digital Logic Applications, IEEE Electron Device Letters, vol. 11, No. 1, pp. 31-32, Jan. 1990.

Jelloian et al., InP-Based HEMT's with Al0.48In0.52AsxP1-x Schottdy Layers, IEEE Electron Device Letters, pp. 172-174, May 1994.

Akazaki et al., Kink Effect in an InAs-Inserted-Channel InAlAs/InGaAs Inverted HEMT at Low Temperature, IEEE Electron Device Letters, vol. 17, No. 7, pp. 378-380, Jul. 1996.

Shealy et al., High-Performance Submicrometer Gatelength GaInAs/InP Composite Channel HEMT's with Regrown Ohmic Contacts, IEEE Electron Device Letters, vol. 17, No. 11, pp. 540-542, Nov. 1996.

Robert E. Thorne, et al.; Analysis of Camel Gate FET's (CAMFET's) (IEEE Electron Devices Society, vol. ED-30, No. 3, Mar. 1983 pp. 212-216.

GaAs Semiconductor-insulator-semiconductor field-effect transistor with a planar-doped barrier gate; author: Domingo A. Figuerdo, et al. (Applied Physics Letters, vol. 52, No. 17, pp. 1395-1988)—Apr. 1988.

J. M. Woodcock, et al.; Bulk Unipolar Diodes in MBE GaAs; (Electronics Letters, vol. 19, No. 5, Mar. 3, 1983) pp. 181-183.

*Primary Examiner*—Edward Wojciechowicz
*Attorney, Agent, or Firm*—David E. Dougherty

[57] ABSTRACT

The invention relates to the structure of the camel-gate field-effect transistor with multiple modulation-doped channels. The device structure, from the bottom to the top in succession, includes the substrate, the buffer layer, the multiple modulation-doped channels, the thin and complete depletion layer, and the ohmic contact layer. The transistor is characterized by a camel-gate diode, which is composed of the multiple modulation-doped channels, the thin and complete depletion layer and the ohmic contact layer. The gate structure may achieve the high potential height between the gate electrode and the source electrode as well as the high breakdown voltage performance. Furthermore, the use of multiple modulation-doped channels, made of n-type GaAs materials with different thickness and doped concentration, can exhibit excellent properties of high output current, large and linear transconductances.

4 Claims, 4 Drawing Sheets

CAMEL-GATE FIELD-EFFECT TRANSISTOR WITH MULTIPLE MODULATION-DOPED CHANNELS

BACKGROUND OF THE INVENTION

1. Field of the Invention

This invention relates to the fabrication and structures of the high-speed microwave, and high-power transistors. Particularly, its relates to the fabrication process and structure of the transistor with the performances of high potential barrier height, high breakdown voltage, and high linear transconductance etc.

2. Description of the Prior Art

It is very popular, in the electronic IC field, to fabricate high-speed, microwave, and high-power devices with compound semiconductor materials. This performances becomes more significant especially in the recently rapidly-developed personal, satellite communication, and wireless data transmission application. The high-speed, microwave, high-power devices fabricated by compound semiconductors, such as heterostructure field effect transistor (HFET) and heterojunction bipolar transistor (HBT), always play an important role on the circuit applications.

The metal-semiconductor field effect transistor (MESFET) has been used widely in the recently digital IC and analog IC circuits. The MESFET device is made by the n-type GaAs materials. The gate metal is made by a Schottky-type metal deposited on the semiconductor surface and the electrode isolations between gate-source and gate-drain terminals are formed by chemical etching process.

The traditional MESFETs, however, have the following problems. Since the transistor gate is a Schottky contact, the gate quality and transistor performance will be degraded when the temperature increases. Furthermore, the barrier height of the Schottky gate is fixed and usually lower than 0.8 eV. On the other hand, for another FET, i.e., the camel-gate field effect transistor (CAMFET), a single step-doped channel is employed. For a high-doped channel is used, a high output transconductance and an enhancement-type FET may be obtained. Yet, the drawbacks of lower barrier potential height of gate, lower current, small operation regime and lower output power are also presented. On the contract, a low-doped channel will result in the high output current, high gate barrier height, linear output transconductance, and smaller value of transconductance. Therefore, for a single doped-channel FET, there exist both advantage and disadvantage no matter the doping level is high or low. Besides, the popular photodetectors are n-p structure while MESFET is only of n-type structure. So, it is inconvenient for MESFET to match the photodetector in the integrated circuit applications.

SUMMARY OF THE INVENTION

This invention is about the gate electrode of the transistor, formed by a multiple modulation-doped channel, a thin and depletion layer and an ohmic contact layer. FIG. 2 is the energy band diagram of the gate region. It is called camel-gate diode because the energy band structure formed by doped concentration ($N_d$) of the ohmic contact layer, the thin and depletion layer ($N_a$) and the multiple modulation-doped channel (N1, N2, & N3), looks like a camel-form Compared with the other field-effect transistors, the transistor with the diode as its gate has the following advantages: 1) It can regulate the potential barrier height by changing the doping concentration of $n^+/p^+/n$ structure of the camel-gate diode, and the potential barrier height can reach 1.1 V. So it can effectively reduce the leakage current of the gate. 2) The stability and reliability is high as the gate is an ohmic contact structure, particularly while working under the conditions of high temperature or working in the integrated circuits. 3) The gate-source and the gate-drain are insulated without etching because the structure of the transistor has the thin and complete depletion layer of $p^+$ GaAs, and the ohmic contact layer of thin $n^+$-GaAs is almost completely depleted. It is simple to design and easy to make the structure. 4) The transistor is of n-p type structure, therefore it can be made on the same substrate together with the photodetector. If the light absorbed by the photodetector it can be amplified by the transistor. This can be regarded as the base for developing optoelectronic integrated circuits (OEIC).

Besides the multiple modulation-doped channels design of the invention can improve the disadvantages of single step-doped channel FET. The good performents such as high current, large and linear transconductance may be obtained. With the modulation-doped channel of triple step-layer structure as an example, when the gate-source ($V_{GS}$) voltage is negative, the active channels are the second layer (intermediate doped concentration) and the third layer(high doped concentration). At this time, it is similar to a common MIS-type field effect transistor. The effective doped concentration of the channel is high which yields a high value of the transconductance. When the positive $V_{GS}$ is applied, the active channel will extend from the third layer ( high doped concentration) to the first layer (low doped concentration) .The low doped channel of the first layer, together with the $n^+$ and $p^+$ layer form the common camel-gate transistor. At the same time, the intermediately doped channel of the second layer and the highly doped channel of the third layer will increase the saturation current of the devices. However, the value of the transconductance is still high. The main reason is that the depletion region of the first layer reduces quickly when the positive gate-source voltage is applied.

The objective of the invention is to produce a high-speed, microwave, and high -power transistor with high potential barrier height, high breakdown voltage, large and linear transconductance. This structure can effectively improve the transistor performances. Besides being applicable to amplification, high-power and high-frequency circuits, it is compatible with photodetectors. This provides a good base to develop the optoelectronic integrated circuits (OEIC).

BRIEF DESCRIPTION OF THE DRAWINGS

The invention, as well as its many advantages, may be further understood by the following detailed description and drawings in which.

Illustration of the symbols.

10 . . . The example of the camel-gate field-effect transistor with multiple modulation doped channels 12 . . . The substrate formed by the semi-insulated GaAs material 14 . . . The buffer layer formed by the undoped GaAs 20 . . . The bottom layer of the channel formed by high doped n- type GaAs material 22 . . . The middle layer of the channel formed by mediately doped n-type GaAs 24 . . . The top layer of the channel formed by light doped n- type GaAs 30 . . . The complete depletion layer formed by p+ type GaAs material 32 . . . The ohmic contact layer formed by n+ type GaAs S . . . The source (electrode)

D . . . The drain (electrode)

G . . . The gate (electrode)

$N_d$ . . . The concentration of the n+ type GaAs material of the ohmic contact layer $N_a$ . . . The concentration of p+ type GaAs material of completed depletion layer d . . . The depletion region thickness of the n+ type GaAs material of the ohmic contact layer t . . . The thickness of the p+ . . . type GaAs material of the completed depletion layer N1 . . . The concentration of n-type GaAs material of the upmost channel layer N2 . . . The concentration of n-type GaAs material of the middle channel layer N3 . . . The concentration of n-type GaAs material of the bottom channel layer d1 . . . The thickness of n-type GaAs material of the upmost channel layer d2 . . . The thickness of the n-type GaAs material of the middle channel layer d3 . . . The thickness of the n-type GaAs material of the bottom channel layer $\phi_b$ . . . The potential barrier height $E_F$ . . . The Fermi energy level $V_{n1}$ . . . The potential difference between the bottom channel layer and the Fermi level $V_n2$ . . . The potential difference between conduction band of the n+ type GaAs ohmic contact layer and the Fermi level W . . . The thickness of the depletion region

DETAILED DESCRIPTION OF THE PREFERRED EMBODIMENT

Figure 1:
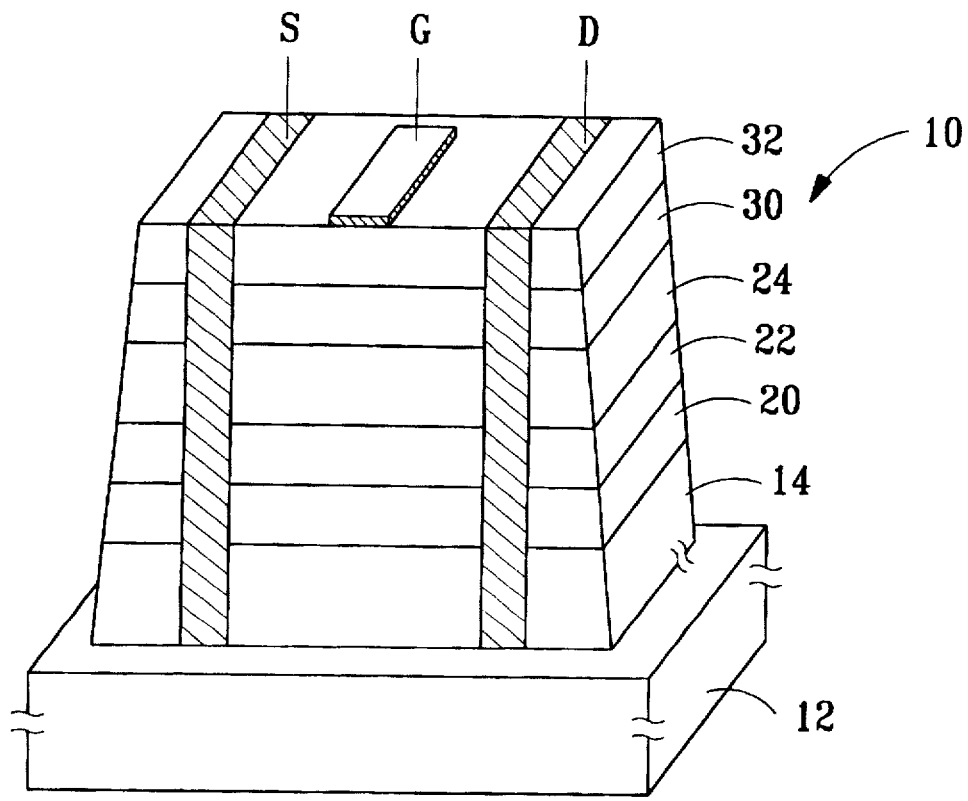
FIG. 1 is the structure diagram of the camel-gate field-effect transistor with multiple modulation-doped channels.

FIG. 1 is one of the practical examples 10 of the invention, which the device structured, from the bottom to the top is successive, one: the structure 12 of the semi-insulated GaAs, the buffer layer 14 of undoped GaAs with the thickness of 5000Å; the bottom channel layer 20 of n-type GaAs with the thickness of 200Å and doped concentration of $5\times10^{17}cm^{-3}$; the middle channel layer 22 of n-type GaAs with the thickness of 400Å and doped concentration of $2.5\times10^{17}cm^{-3}$, the top channel layer 24 of n-type GaAs with the thickness of 100Å and doped concentration of $1\times10^{17}cm^{-3}$; the complete depletion layer 30 of p+-type GaAs with the thickness of 100Å and doped concentration of $8\times10^{18}cm^{-3}$; the ohmic contact layer 32 of n+-type GaAs with the thickness of 200Å and doped concentration of $6\times10^{18}cm^{-3}$.

Figure 2:
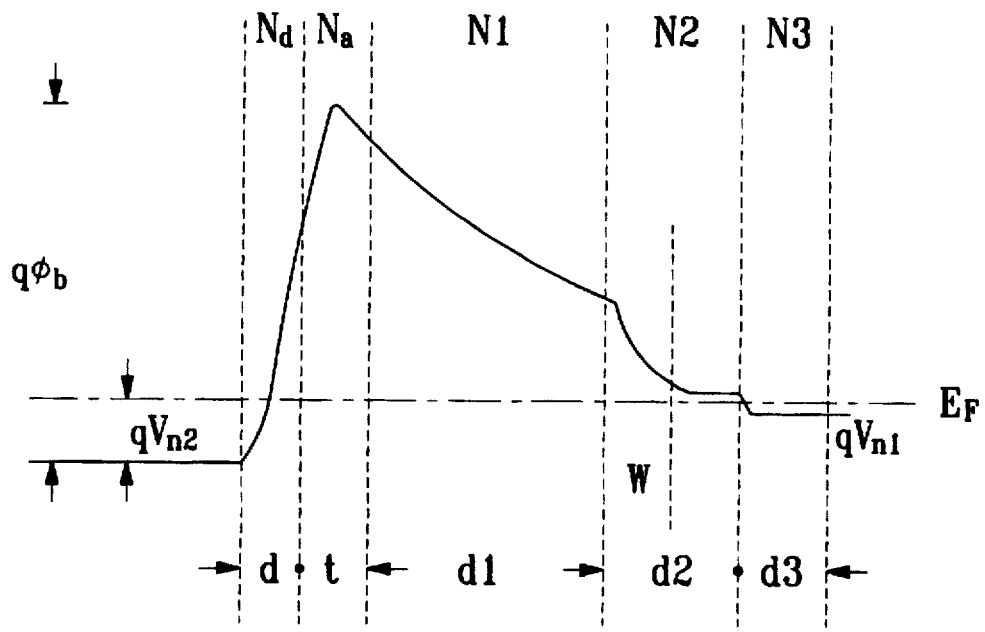
FIG. 2 is the energy band diagram of the camel-gate field-effect transistor with multiple modulation-doped channels.
Figure 3:
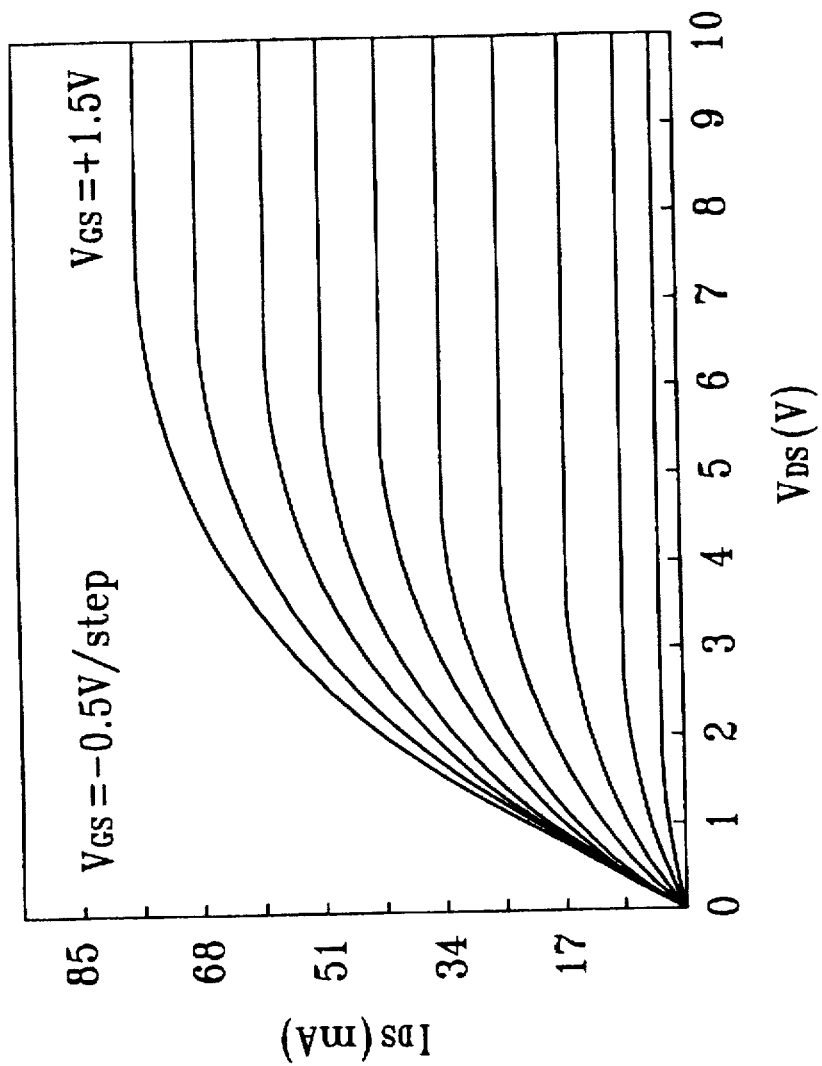
FIG. 3 shows the characteristic curve of the current ($I_{DS}$)-voltage ($V_{DS}$) of the camel-gate field-effect transistor with multiple modulation-doped channels.
Figure 4:
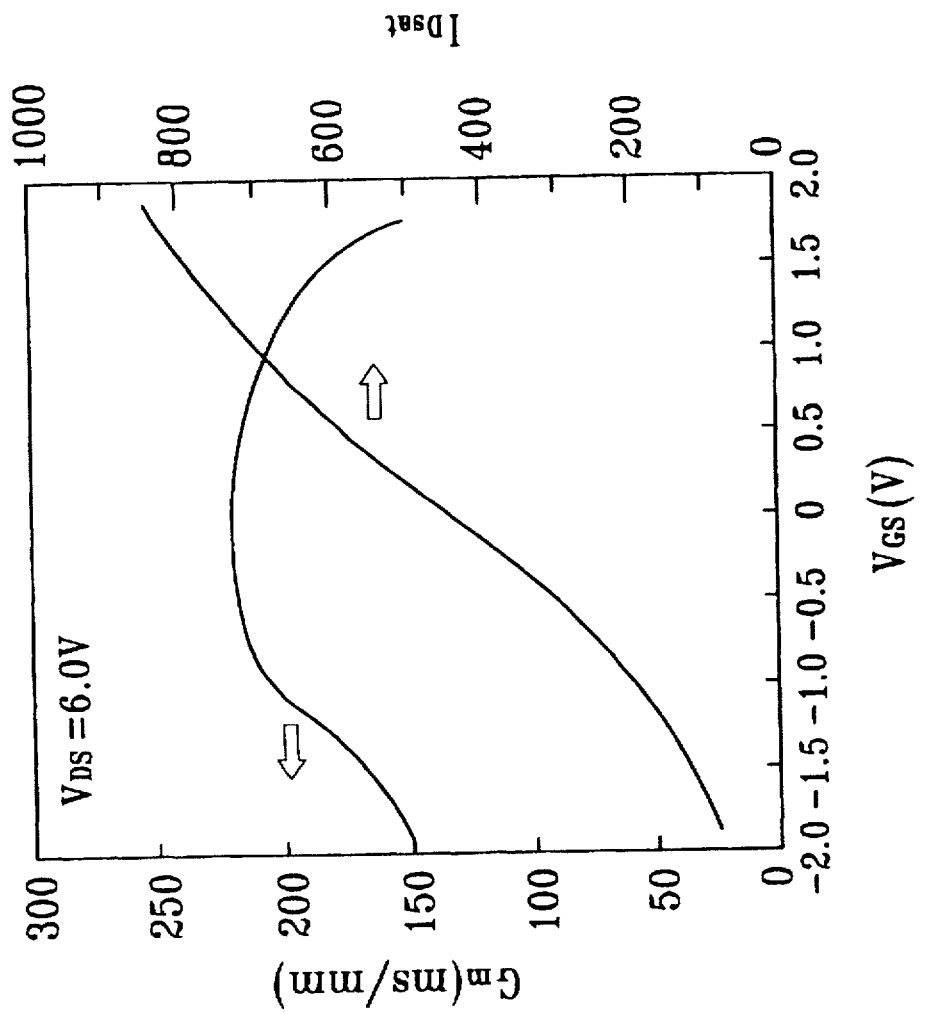
FIG. 4 is the relationship between the transduction (Gm), the maximum saturated current ($I_{Dsat}$) and the gate-source voltage ($V_{GS}$) of the camel-gate field-effect transistor with multiple modulation-doped channels.
Figure 5:
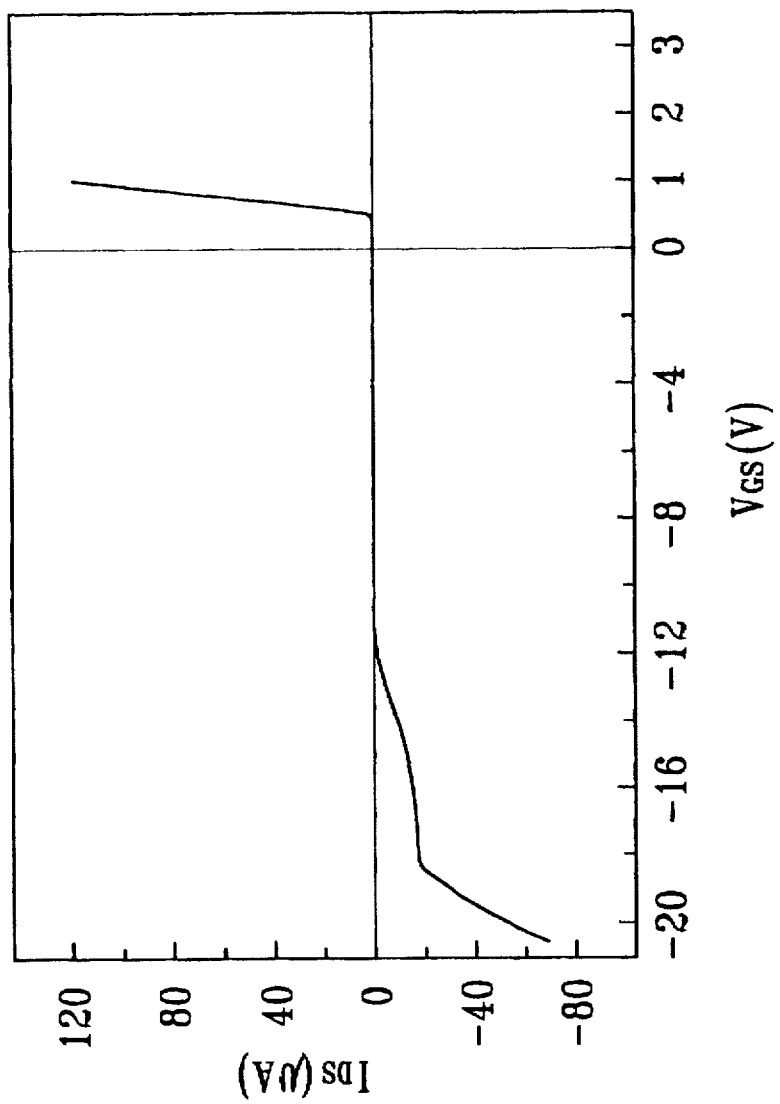
FIG. 5 is a diagram showing the current ($I_{DS}$-voltage ($V_{GS}$) characteristics of the camel-gate field-effect transistor with multiple modulation-doped channels under inverted operation mode.

Its relative energy band diagram of the gate is shown in FIG. 2. With the present device with a gate dimension of 1.5×100 µm² as an example, its maximum transcanductance is as high as 220 mS/mm, the maximum output current is 850 mA/mm, and the current-voltage characteristics of the transistor is shown in FIG. 3. FIG. 4 shows the relationship between the transconductance, the maximum saturation current and the gate-source voltage. The characteristics of the gate-source electrodes of the present device is excellent, and when the leakage current of the gate is 1 mA/mm, the breakdown voltage can reach 21 V, as shown in FIG. 5. This is suited to be applied in the design of highly quality gate. Besides, the $C_{gs}$ value of the present device is 128fF by C—V measurement, its cut-off frequency can reach 30 GHZ, which are also applicable to be operated within the high frequency and microwave regime.

References:

1. R. E. Throne, S. L. Su, R. I J. Fischer, W. F. Kopp, W. G. Lyons, P. A. Miller and H. Morkoc, "Analysis of camel gate FET's(CAMFET's)", IEEE Trans. Electron Devices, Vol. ED-30, No.3, pp. 212–216, 1983

2. D. A. Figueredo, M. P. Zurakowaski, S. S. Elliott, W. J. Anldan and S. R. Sloan, "GaAs semiconductor-insulator field-effect transistor with a planar—doped barrier gate," Appl. Phy. Lett., Vol.52, No.17, pp1395, 1988.

3. J. M. Woodcock and J. J. Harries, "Bulk unipolar diodes in MBE GaAs," Electroni Lett., Vp1.19 No.5, pp.181–183, 1983.

Many changes and modifications in the above described embodiment of the invention can, of course, be carried out without departing from the scope thereof Accordingly, to promote the progress in science and the useful arts, the invention is disclosed and is intended to be limited only by the scope of the appended claims.

What is claimed is:

1. A field-effect transistor with a high-medium-low doped channel comprising a semi-insulated GaAs substrate, a buffer layer of undoped GaAs deposited on said substrate and a high-medium-low doped channel formed on top of said buffer layer, a completely depleted layer formed on the high-medium-low doped channel and an ohmic contact layer formed on the completely depleted layer, and wherein the high-medium-low doped channel, the completely depleted layer and the ohmic contact layer form a camel-gate diode and wherein the transistor includes a gate-electrode having a high potential barrier height and a high breakdown voltage when the camel-gate diode is used as the gate of the transistor, and wherein the transistor, when subjected to high current, has a large and linear transconductance when the high-medium-low doped channel is used as the channel of the transistor, said high-medium-low channel comprising individual layers of semiconductor material having different thicknesses and doped concentrations than the other layers, and wherein the thickness of said layers in said high-medium-low doped channel decreases from the top layer down toward the substrate and the doped concentration increases from the top layer down toward the substrate and wherein said high-medium-low doped channel includes an n-type GaAs bottom layer with a thickness of 200Å and a doped concentration of $5\times10^{17}cm^{-3}$ on the buffer layer, an n-type GaAs middle layer with a thickness of 400Å and doped concentration of $2.5\times10^{17}cm^{-3}$ on the bottom layer, and an n-type GaAs top layer with a thickness of 1000Å and a doped concentration of $1\times10^{17}cm^{-3}$ on the middle layer.

2. A field-effect transistor with a high-medium-low doped channel according to claim 1, wherein said thin and completely depleted layer is a p⁺-type GaAs layer with a thickness of 100Å and a doped concentration of $8\times10^{18}cm^{-3}$.

3. A field-effect transistor with a high-medium-low doped channel according to claim 2, wherein said ohmic contact layer is an n⁺-type GaAs ohmic contact layer with a thickness of about 200Å and a doped concentration of about $6\times10^{18}cm^{-3}$.

4. A field-effect transistor with a high-medium-low doped channel according to claim 1 wherein said buffer layer is an undoped GaAs layer with a thickness of 5000Å.

* * * * *